United States Patent
Holland et al.

(10) Patent No.: US 7,436,645 B2
(45) Date of Patent: Oct. 14, 2008

(54) METHOD AND APPARATUS FOR CONTROLLING TEMPERATURE OF A SUBSTRATE

(75) Inventors: John Holland, San Jose, CA (US); Theodoros Panagopoulos, San Jose, CA (US); Alexander Matyushkin, San Jose, CA (US); Dan Katz, Saratoga, CA (US); Michael F. Hegarty, Sunnyvale, CA (US); Denis M. Koosau, Hayward, CA (US); Nicolas Gani, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/531,474

(22) Filed: Sep. 13, 2006

(65) Prior Publication Data

US 2007/0139856 A1   Jun. 21, 2007

Related U.S. Application Data

(63) Continuation-in-part of application No. 11/246,012, filed on Oct. 7, 2005, which is a continuation-in-part of application No. 10/960,874, filed on Oct. 7, 2004.

(51) Int. Cl.
*H01T 23/00* (2006.01)
(52) U.S. Cl. .................................... 361/234; 361/230
(58) Field of Classification Search ......... 361/230–234; 156/345.34, 345.51
See application file for complete search history.

(56) References Cited

U.S. PATENT DOCUMENTS 5,838,528 A * 11/1998 Os et al. ............... 361/234
6,035,101 A   3/2000 Sajoto et al.
6,129,046 A * 10/2000 Mizuno et al. ............ 118/725

(Continued)

FOREIGN PATENT DOCUMENTS

| CN | 2585414 | 10/2003 |
|---|---|---|
| JP | 091770 A | 1/1997 |
| JP | 10209257 A | 8/1998 |

OTHER PUBLICATIONS

Translation of Chinese Office Action for CN Application No. 200510116536.0, copy consists of 10unnumbered pages.

(Continued)

*Primary Examiner*—Michael J Sherry
*Assistant Examiner*—Danny Nguyen
(74) *Attorney, Agent, or Firm*—Patterson & Sheridan, LLP

(57) ABSTRACT

A pedestal assembly and method for controlling temperature of a substrate during processing is provided. In one embodiment, the pedestal assembly includes an electrostatic chuck coupled to a metallic base. The electrostatic chuck includes at least one chucking electrode and metallic base includes at least two fluidly isolated conduit loops disposed therein. In another embodiment, the pedestal assembly includes a support member that is coupled to a base by a material layer. The material layer has at least two regions having different coefficients of thermal conductivity. In another embodiment, the support member is an electrostatic chuck. In further embodiments, a pedestal assembly has channels formed between the base and support member for providing cooling gas in proximity to the material layer to further control heat transfer between the support member and the base, thereby controlling the temperature profile of a substrate disposed on the support member.

14 Claims, 11 Drawing Sheets

U.S. PATENT DOCUMENTS

| | | |
|---|---|---|
| 6,256,187 B1 | 7/2001 | Matsunaga et al. |
| 6,310,755 B1 | 10/2001 | Kholodenko et al. |
| 6,664,738 B2 | 12/2003 | Arai et al. |
| 6,793,767 B2 * | 9/2004 | Chu et al. .............. 156/345.43 |
| 6,853,533 B2 | 2/2005 | Parkhe |
| 7,221,553 B2 | 5/2007 | Nguyen et al. |
| 2002/0021545 A1 | 2/2002 | Tatsumi et al. |
| 2002/0050246 A1 | 5/2002 | Parkhe |
| 2002/0170882 A1 | 11/2002 | Akiba |
| 2003/0155079 A1 | 8/2003 | Bailey et al. |
| 2003/0164226 A1 | 9/2003 | Kanno et al. |
| 2003/0230551 A1 | 12/2003 | Kagoshima et al. |
| 2004/0061449 A1 | 4/2004 | Arai et al. |
| 2004/0185670 A1 | 9/2004 | Hamelin et al. |
| 2004/0187787 A1 | 9/2004 | Dawson et al. |
| 2004/0195216 A1 | 10/2004 | Strang |
| 2004/0261721 A1 | 12/2004 | Steger |
| 2005/0042881 A1 | 2/2005 | Nishimoto et al. |
| 2006/0076108 A1 | 4/2006 | Holland et al. |
| 2006/0076109 A1 | 4/2006 | Holland et al. |
| 2006/0158821 A1 | 7/2006 | Miyashita |
| 2007/0102118 A1 | 5/2007 | Holland et al. |
| 2007/0139856 A1 | 6/2007 | Holland et al. |
| 2007/0258186 A1 | 11/2007 | Matyushkin et al. |

OTHER PUBLICATIONS

Claims co-pending U.S. Appl. No. 11/740,869 filed Apr. 26, 2007.
Claims co-pending U.S. Appl. No. 11/778,019 filed Jul. 14, 2007.
International Search Report for PCT/US 06/07525.
Wait, R.K.. Monitoring residual and process gases in PVD processes: The importance of sensitivity. Micromagazine, Jun. 1997.
Second Office Action for Chinese Application No. 200510116536.0, May 30, 2008, Copy consists of seven pages (1-3 and 1-4) (APPM/9259 CN) - provides a concise explanation of relevance for B1.

* cited by examiner

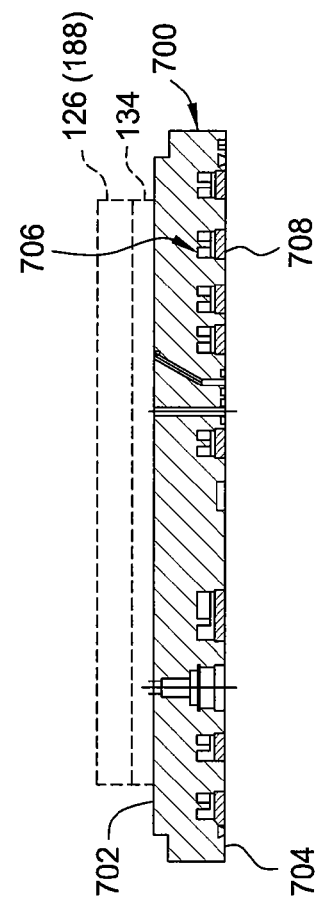
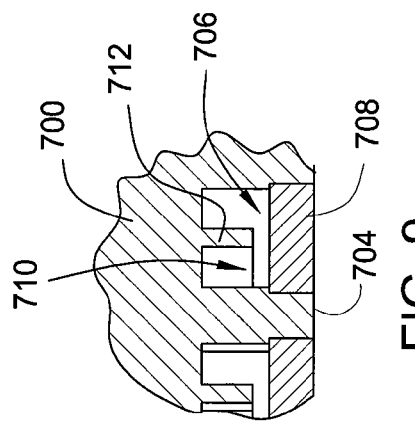
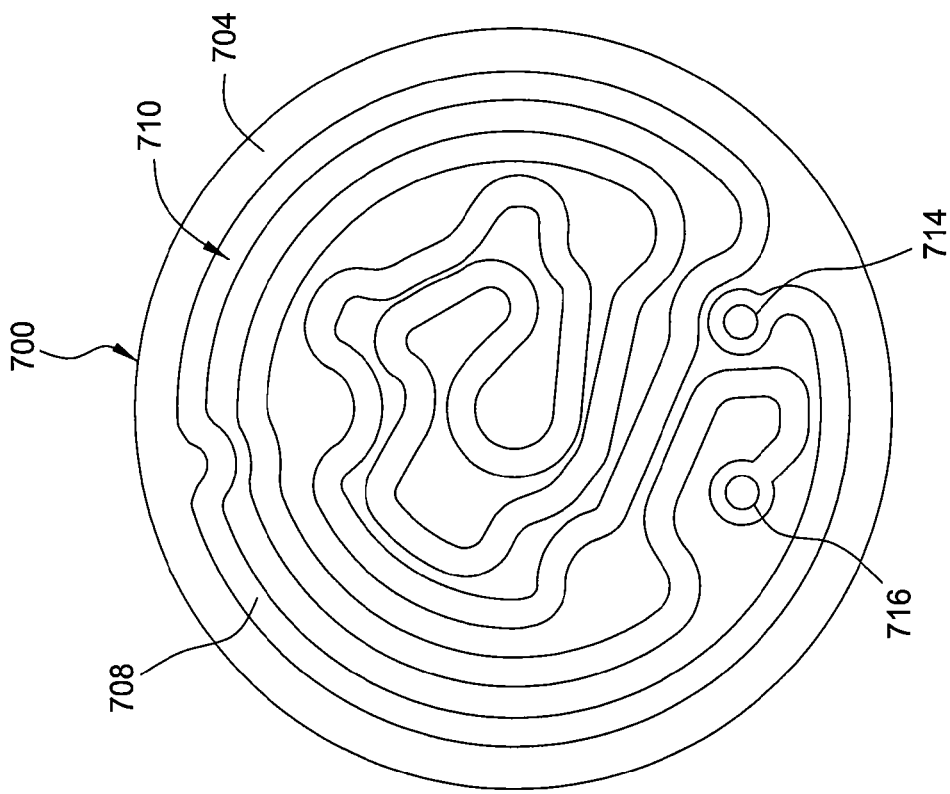
FIG. 7
FIG. 9
FIG. 8

METHOD AND APPARATUS FOR CONTROLLING TEMPERATURE OF A SUBSTRATE

CROSS-REFERENCE TO RELATED APPLICATIONS

This application is a continuation-in-part application of co-pending U.S. patent application Ser. No. 11/246,012, filed Oct. 7, 2005, which is a continuation-in-part application of co-pending U.S. patent application Ser. No. 10/960,874, filed Oct. 7, 2004, both of which are incorporated by reference in their entireties.

BACKGROUND OF THE INVENTION

1. Field of the Invention

Embodiments of the present invention generally relate to semiconductor substrate processing systems. More specifically, the invention relates to a method and apparatus for controlling temperature of a substrate in a semiconductor substrate processing system.

2. Description of the Related Art

In manufacture of integrated circuits, precise control of various process parameters is required for achieving consistent results within a substrate, as well as the results that are reproducible from substrate to substrate. During processing, changes in the temperature and temperature gradients across the substrate may be detrimental to material deposition, etch rate, step coverage, feature taper angles, and other parameters of semiconductor devices. As such, generation of the predetermined pattern of temperature distribution across the substrate is one of critical requirements for achieving high yield.

In some processing applications, a substrate is retained to a substrate pedestal by an electrostatic chuck during processing. The electrostatic chuck is coupled to a base of the pedestal by clamps, adhesive or fasteners. The chuck may be provided with an embedded electric heater, as well as be fluidly coupled to a source of backside heat transfer gas for controlling substrate temperature during processing. However, conventional substrate pedestals have insufficient means for controlling substrate temperature distribution across the diameter of the substrate. The inability to control substrate temperature uniformity has an adverse effect on process uniformity both within a single substrate and between substrates, device yield and overall quality of processed substrates.

Therefore, there is a need in the art for an improved method and apparatus for controlling temperature of a substrate during processing the substrate in a semiconductor substrate processing apparatus.

SUMMARY OF THE INVENTION

The present invention generally is a method and apparatus for controlling temperature of a substrate during processing the substrate in a semiconductor substrate processing apparatus. The method and apparatus enhances temperature control across the diameter of a substrate, and may be utilized in etch, deposition, implant, and thermal processing systems, among other applications where the control of the temperature profile of a workpiece is desirable.

In one embodiment of the invention, a substrate pedestal assembly is provided that includes a metallic base coupled to a bottom surface of an electrostatic chuck. An aperture extends through the base. A fluid conduit is disposed in at least one of the electrostatic chuck and the base, wherein the fluid conduit includes a segment wrapping around the aperture.

In another embodiment, a substrate pedestal assembly is provided that includes an electrostatic chuck having at least one chucking electrode disposed between a substrate supporting surface and a bottom surface and a metallic base having a top surface coupled to the bottom surface of the electrostatic chuck, at least one of the electrostatic chuck or the base having a void defined therein. A fluid conduit is disposed in the base and arranged substantially parallel to the top surface. The fluid conduit has a major curvature oriented about a center of the base and a minor curvature oriented about the aperture.

In another embodiment, a substrate pedestal assembly is provided that includes an electrostatic chuck coupled to a metallic base. The electrostatic chuck includes at least one chucking electrode and metallic base includes at least two fluidly isolated conduit loops disposed therein.

In another embodiment, the pedestal assembly includes a support member that is coupled to a base by a material layer. The material layer has at least two regions having different coefficients of thermal conductivity. In another embodiment, the substrate pedestal assembly includes an electrostatic chuck. In further embodiments, a pedestal assembly has channels formed between the base and support member for providing cooling gas in proximity to the material layer to further control heat transfer between the support member and the base, thereby controlling the temperature profile of a substrate disposed on the support member.

The pedestal assembly includes a support member that is coupled to a base using a material layer. The material layer has at least two regions having different coefficients of thermal conductivity. In another embodiment, the support member is an electrostatic chuck. In further embodiments, a pedestal assembly has channels formed between the base and support member for providing cooling gas in proximity to the material layer to further control heat transfer between the support member and the base, thereby facilitating control of the temperature profile of a substrate disposed on the support member.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7 is a vertical sectional view of another embodiment of a base of a pedestal assembly;

FIG. 8 is a bottom view of the base of FIG. 7;

FIG. 9 is a partial sectional view of the base of FIG. 7;

Figure 1A:
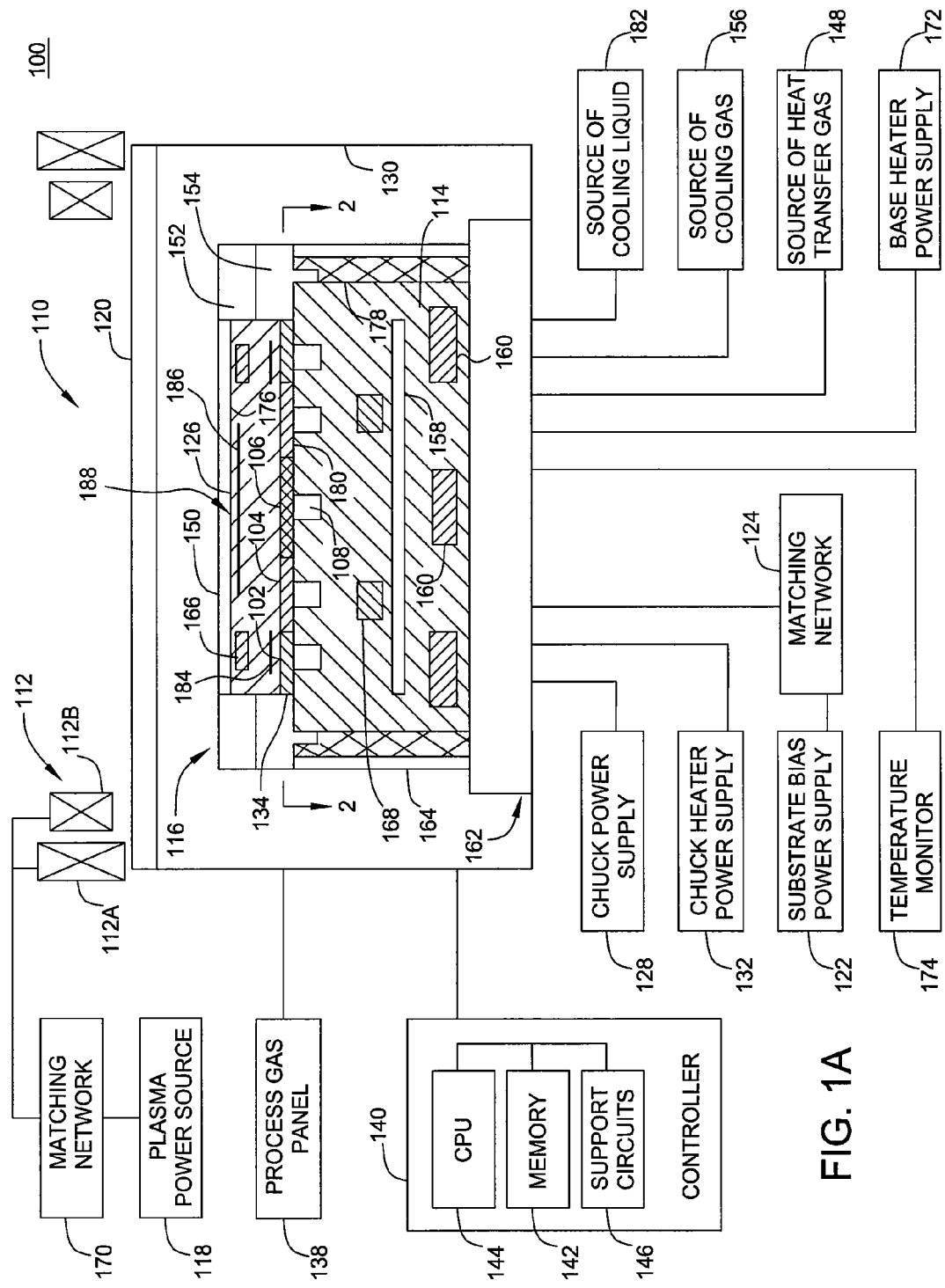
FIG. 1A is a schematic diagram of an exemplary semiconductor substrate processing apparatus comprising a substrate pedestal in accordance with one embodiment of the invention.

To facilitate understanding, identical reference numerals have been used, where possible, to designate identical elements that are common to the figures. It is also contemplated that elements and features of one embodiment may be beneficially incorporated on other embodiments without further recitation.

DETAILED DESCRIPTION

The present invention generally is a method and apparatus for controlling temperature of a substrate during processing. Although invention is illustratively described in a semiconductor substrate processing apparatus, such as, e.g., a processing reactor (or module) of a CENTURA® integrated semiconductor wafer processing system, available from Applied Materials, Inc. of Santa Clara, Calif., the invention may be utilized in other processing systems, including etch, deposition, implant and thermal processing, or in other application where control of the temperature profile of a substrate or other workpiece is desirable.

Figure 1B:
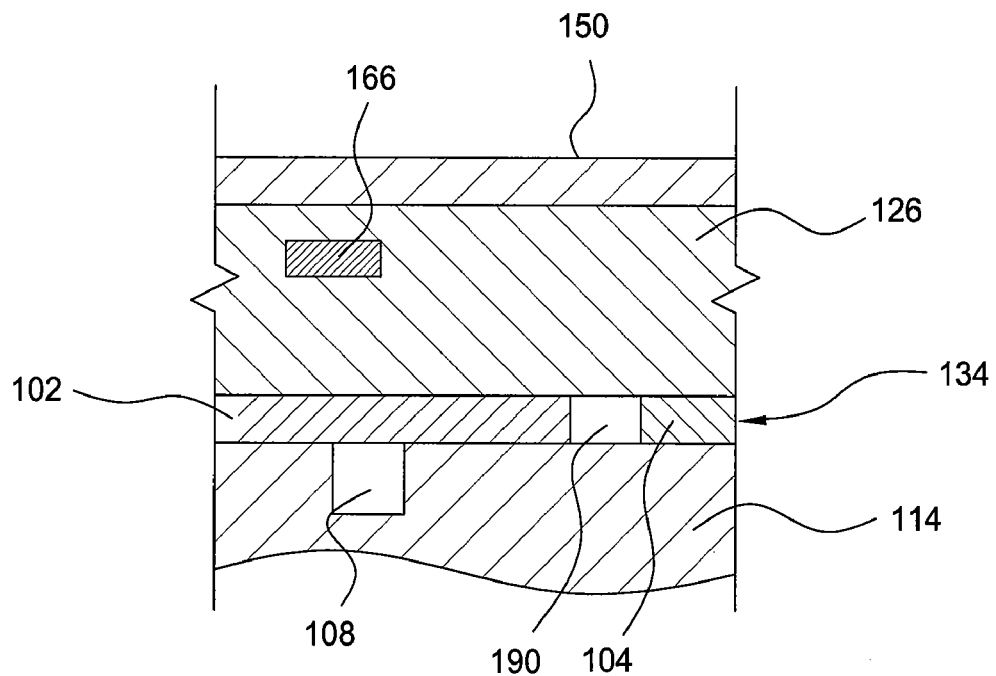
FIGS. 1B-1C are partial cross-sectional views of embodiments of a substrate pedestal having gaps formed in different locations in a material layer of the substrate pedestal.

FIG. 1 depicts a schematic diagram of an exemplary etch reactor 100 having one embodiment of a substrate pedestal assembly 116 that may illustratively be used to practice the invention. The particular embodiment of the etch reactor 100 shown herein is provided for illustrative purposes and should not be used to limit the scope of the invention.

Etch reactor 100 generally includes a process chamber 110, a gas panel 138 and a controller 140. The process chamber 110 includes a conductive body (wall) 130 and a ceiling 120 that enclose a process volume. Process gasses are provided to the process volume of the chamber 110 from the gas panel 138.

The controller 140 includes a central processing unit (CPU) 144, a memory 142, and support circuits 146. The controller 140 is coupled to and controls components of the etch reactor 100, processes performed in the chamber 110, as well as may facilitate an optional data exchange with databases of an integrated circuit fab.

In the depicted embodiment, the ceiling 120 is a substantially flat dielectric member. Other embodiments of the process chamber 110 may have other types of ceilings, e.g., a dome-shaped ceiling. Above the ceiling 120 is disposed an antenna 112 comprising one or more inductive coil elements (two co-axial coil elements 112A and 112B are illustratively shown). The antenna 112 is coupled, through a first matching network 170, to a radio-frequency (RF) plasma power source 118.

In one embodiment, the substrate pedestal assembly 116 includes a support member 126, a thermoconductive layer 134, a base 114, a collar ring 152, a joint ring 154, a spacer 178, a ground sleeve 164 and a mount assembly 162. The mounting assembly 162 couples the base 114 to the process chamber 110. The base 114 is generally formed from aluminum or other metallic material. In the depicted embodiment, the base 114 further comprises at least one optional embedded heater 158 (one heater 158 is illustratively shown), at least one optional embedded insert 168 (one annular insert 168 is illustratively shown), and a plurality of optional conduits 160 fluidly coupled to a source 182 of a heating or cooling liquid. In this embodiment, the base 114 is further thermally separated from the ground sleeve 164 using an optional spacer 178.

The conduits 160 and heater 158 may be utilized to control the temperature of the base 114, thereby heating or cooling the support member 126, thereby controlling, in part, the temperature of a substrate 150 disposed on the support member 126 during processing.

The insert 168 is formed from a material having a different coefficient of thermal conductivity than the material of the adjacent regions of the base 114. Typically, the inserts 168 has a smaller coefficient of thermal conductivity than the base 114. In a further embodiment, the inserts 168 may be formed from a material having an anisotropic (i.e. direction-dependent coefficient of thermal conductivity). The insert 168 functions to locally change the rate of heat transfer between the support member 126 through the base 114 to the conduits 160 relative to the rate of heat transfer though neighboring portions of the base 114 not having an insert 168 in the heat transfer path. Thus, by controlling the number, shape, size, position and coefficient of heat transfer of the inserts, the temperature profile of the support member 126, and the substrate 150 seated thereon, may be controlled. Although the insert 168 is depicted in FIG. 1 shaped as an annular ring, the shape of the insert 168 may take any number of forms.

The thermoconductive layer 134 is disposed on a chuck supporting surface 180 of the base 114 and facilitates thermal coupling (i.e., heat exchange) between the support member 126 and the base 114. In one exemplary embodiment, the thermoconductive layer 134 is an adhesive layer that mechanically bonds the support member 126 to member supporting surface 180. Alternatively (not shown), the substrate pedestal assembly 116 may include a hardware (e.g., clamps, screws, and the like) adapted for fastening the support member 126 to the base 114. Temperature of the support member 126 and the base 114 is monitored using a plurality of sensors (not shown), such as, thermocouples and the like, that are coupled to a temperature monitor 174.

The support member 126 is disposed on the base 114 and is circumscribed by the rings 152, 154. The support member 126 may be fabricated from aluminum, ceramic or other materials suitable for supporting the substrate 150 during processing. In one embodiment, the support member 126 is ceramic. The substrate 150 may rest upon the support member 126 by gravity, or alternatively be secured thereto by vacuum, electrostatic force, mechanical clamps and the like. The embodiment depicted in FIG. 1, the support member 126 is an electrostatic chuck 188.

The electrostatic chuck 188 is generally formed from ceramic or similar dielectric material and comprises at least one clamping electrode 186 controlled using a power supply 128. In a further embodiment, the electrostatic chuck 188 may comprise at least one RF electrode (not shown) coupled, through a second matching network 124, to a power source 122 of substrate bias, and may also include at least one embedded heater 184 controlled using a power supply 132.

The electrostatic chuck 188 may further comprise a plurality of gas passages (not shown), such as grooves, that are formed in a substrate supporting surface 176 of the chuck and fluidly coupled to a source 148 of a heat transfer (or backside) gas. In operation, the backside gas (e.g., helium (He)) is provided at controlled pressure into the gas passages to enhance the heat transfer between the electrostatic chuck 188 and the substrate 150. Conventionally, at least the substrate supporting surface 176 of the electrostatic chuck is provided with a coating resistant to the chemistries and temperatures used during processing the substrates.

In one embodiment, the support member 126 comprises at least one embedded insert 166 (one annular insert 166 is illustratively shown) formed from at least one material having a different coefficient of thermal conductivity than the material(s) of adjacent regions of the support member 126. Typically, the inserts 166 are formed from materials having a smaller coefficient of thermal conductivity than the material(s) of the adjacent regions. In a further embodiment, the inserts 166 may be formed from materials having an anisotropic coefficient of thermal conductivity. In an alternate embodiment (not shown), at least one insert 166 may be disposed coplanar with the substrate supporting surface 176.

As with the inserts 168 of the base 114, the thermal conductivity, as well as the shape, dimensions, location, and number of inserts 166 in the support member 126 may be selectively chosen to control the heat transfer through the pedestal assembly 116 to achieve, in operation, a pre-determined pattern of the temperature distribution on the substrate supporting surface 176 of the support member 126 and, as such, across the diameter of the substrate 150.

The thermoconductive layer 134 comprises a plurality of material regions (two annular regions 102, 104 and circular region 106 are illustratively shown), at least two of which having different coefficients of thermal conductivity. Each region 102, 104, 108 may be formed from at least one material having a different coefficient of thermal conductivity than the material(s) of adjacent regions of the thermoconductive layer 134. In a further embodiment, one or more of the materials comprising the regions 102, 104, 106 may have an anisotropic coefficient of thermal conductivity. For example, coefficients of thermal conductivity of materials in the layer 134 in the directions orthogonal or parallel to the member supporting surface 180 may differ from the coefficients in at least one other direction. The coefficient of thermal conductivity between the regions 102, 104, 106 of the layer 134 may be selected to promote laterally different rates of heat transfer between the chuck 126 and base 114, thereby controlling the temperature distribution across the diameter of the substrate 150.

Figure 1C:
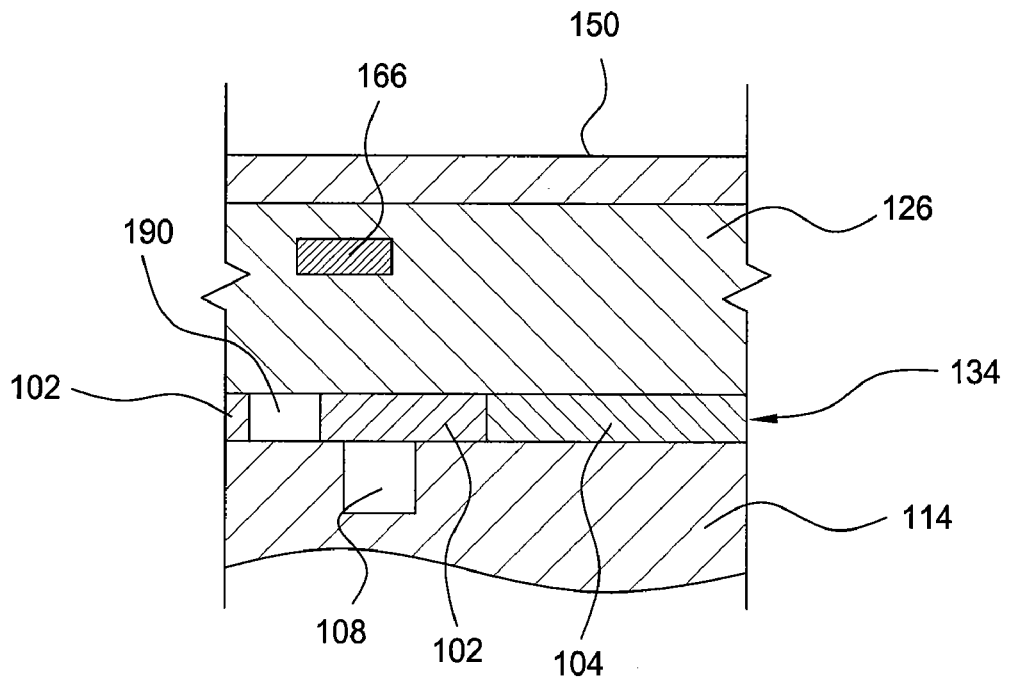

In yet further embodiment, gaps 190 (as shown in FIG. 2A) maybe provided between at least two adjacent regions of the thermoconductive layer 134. In the layer 134, such gaps 190 may form either gas-filled or vacuumed volumes having pre-determined form factors. A gap 190 may alternatively be formed within a region of the layer 134 (as shown in FIG. 1C).

Figure 2:
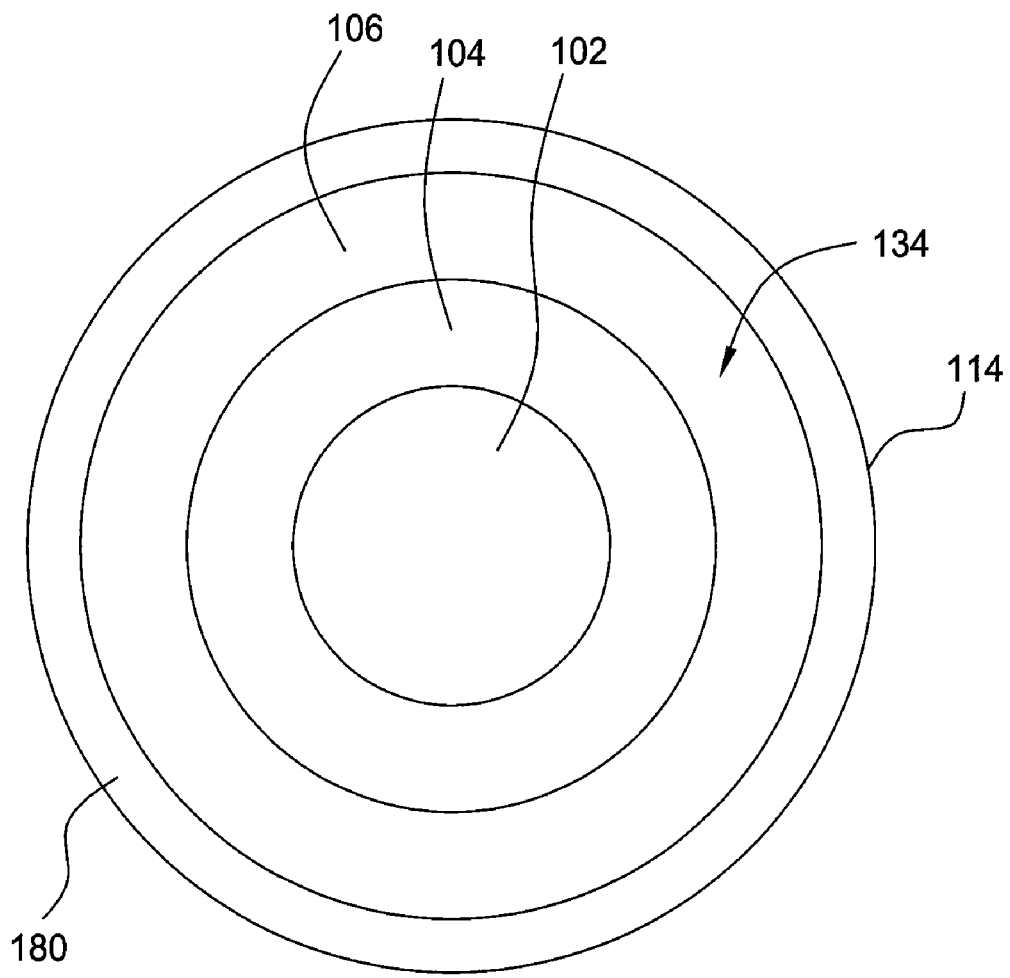
FIG. 2 is a schematic cross-sectional view of the substrate pedestal taken along a line 2-2 of FIG. 1A.

FIG. 2 depicts a schematic cross-sectional view of the substrate pedestal taken along a line 2-2 in FIG. 1A. In the depicted embodiment, the thermoconductive layer 134 illustratively comprises the annular regions 102, 104 and the circular region 106. In alternate embodiments, the layer 134 may comprise either more or less than three regions, as well as regions having different form factors, for example, the regions may be arranged as grids, radially oriented shapes, and polar arrays among others. The regions of the thermoconductive layer 134 may be composed from materials (e.g., adhesive materials) applied in a form of a paste that is further developed into a hard adhesive compound, as well as in a form of an adhesive tape or an adhesive foil. Thermal conductivity of the materials in the thermoconductive layer 134 may be selected in a range from 0.01 to 200 W/mK and, in one exemplary embodiment, in a range from 0.1 to 10 W/mK. In yet another embodiment, the adjacent regions have a difference in thermal conductivities in the range of about 0.1 to 10 W/mK, and may have a difference in conductivity between an inner most and out most regions of the layer 134 of about 0.1 to about 10 W/mK. Examples of suitable adhesive materials include, but not limited to, pastes and tapes comprising acrylic and silicon based compounds. The adhesive materials may additionally include at least one thermally conductive ceramic filler, e.g., aluminum oxide ($Al_2O_3$), aluminum nitride (AlN), and titanium diboride ($TiB_2$), and the like. One example of an adhesive tape suitable for the conductive layer 134 is sold under the tradename THERMATTACH®, available from Chomerics, a division of Parker Hannifin Corporation, located in Wolburn, Mass.

In the thermoconductive layer 134, the thermal conductivity, as well as the form factor, dimensions, and a number of regions having the pre-determined coefficients of thermal conductivity may be selectively chosen to control the heat transfer between the electrostatic chuck 126 and the base 114 to achieve, in operation, a pre-determined pattern of the temperature distribution on the substrate supporting surface 176 of the chuck and, as such, in the substrate 150. To further control the heat transfer through the conductive layer 134 between the base 114 and support member 126, one or more channels 108 are provided to flow a heat transfer medium therethrough. The channels 108 are coupled through the base 114 to a source 150 of heat transfer medium, such as a cooling gas. Some examples of suitable cooling gases include helium and nitrogen, among others. As the cooling gas disposed in the channels 108 is part of the heat transfer path between the chuck 126 and base 114, the position of the channels 108, and the pressure, flow rate, temperature, density and composition of the heat transfer medium of cooling gas provided, provides enhanced control of the heat transfer profile through the pedestal assembly 116. Moreover, as the density and flow rate of gas in the channel 108 may be controlled in-situ during processing of substrate 150, the temperature control of the substrate 150 may be changed during processing to further enhance processing performance. Although a single source 156 of cooling gas is shown, it is contemplated that one or more sources of cooling gas may be coupled to the channels 108 in a manner such that the types, pressures and/or flow rate of cooling gases within individual channels 108 may be independently controller, thereby facilitating an even greater level of temperature control.

Figure 3:
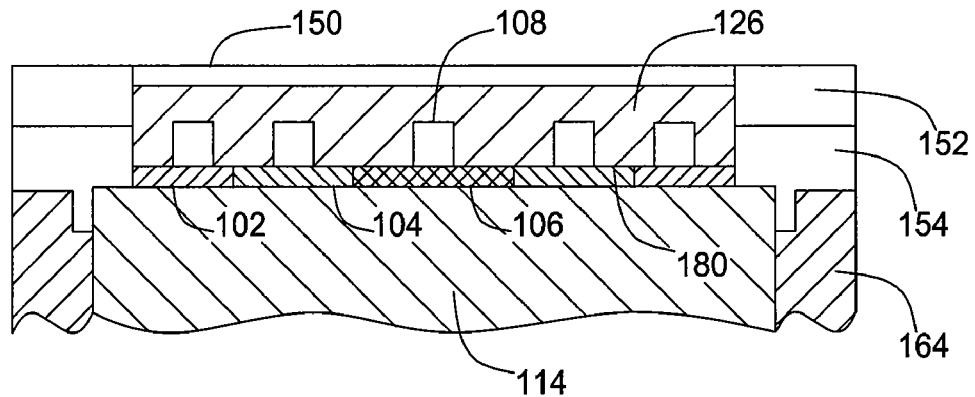
FIG. 3 is a schematic partial cross-sectional view of another embodiment of the invention.
Figure 4:
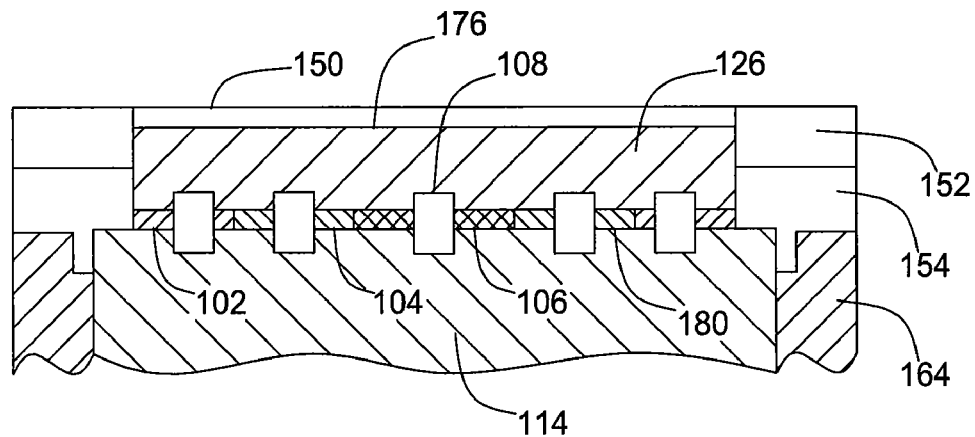
FIG. 4 is a schematic partial cross-sectional view of another embodiment of the invention.
Figure 5:
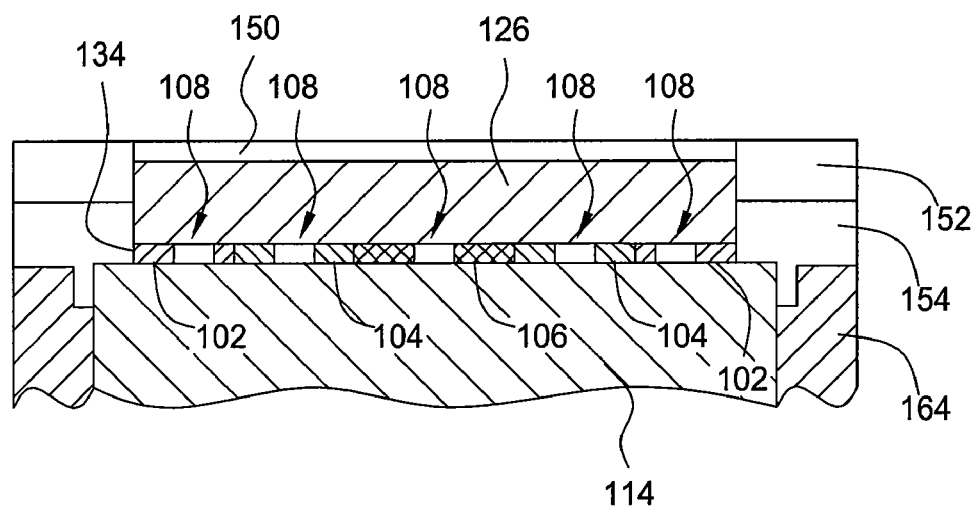
FIG. 5 is a schematic partial cross-sectional view of yet another embodiment of the invention.

In the embodiment depicted in FIG. 1A, the channels 108 are depicted as formed in the member supporting surface 180. However, it is contemplated that the channels 108 may be formed at least partially in the member supporting surface 180, at least partially in the bottom surface of the support member 126, or at least partially in the thermally conductive layer 134, along with combinations thereof. In one embodiment, between about 2 to 10 channels 108 are disposed in the pedestal assembly 116 and provide with the selectivity maintained at a pressure between about 760 Torr (atmospheric pressure) to about 10 Torr. For example, at least one of the channels 108 may be partially or entirely formed in the electrostatic chuck 126, as illustrated in FIGS. 3-4. More specifically, FIG. 3 depicts a schematic diagram of a portion of the substrate pedestal assembly 116 where the channels 108 are formed entirely in the electrostatic chuck 126. FIG. 4 depicts a schematic diagram of a portion of the substrate pedestal assembly 116 where the channels 108 are partially formed in the base 114 and, partially, in the electrostatic chuck 126. FIG. 5 depicts a schematic diagram of a portion of the substrate pedestal assembly 116 where the channels 108 are formed in the thermoconductive layer 134. Although in FIG.

5 the channels are shown disposed between different regions 102, 104, 106 of the thermoconductive layer 134, the one or more of the channels may be formed through one or more of the regions 102, 104, 106.

Returning to FIG. 1A, at least one of the location, shape, dimensions, and number of the channels 108 and inserts 166, 168 as well as the thermal conductivity of the inserts 166, 168 and gas disposed in the channels 108, may be selectively chosen to control the heat transfer between the support member 126 to the base 114 to achieve, in operation, a pre-determined pattern of the temperature distribution on the substrate supporting surface 176 of the chuck 126 and, as such, control the temperature profile of the substrate 150. In further embodiments, the pressure of the cooling gas in at least one channel 108, as well as the flow of the cooling liquid in at least one conduit 156 may also be selectively controlled to achieve and/or enhance temperature control of the substrate. The heat transfer rate may also be controlled by individually controlling the type of gas, pressure and/or flow rate between respective channels 108.

In yet further embodiments, the pre-determined pattern of the temperature distribution in the substrate 150 may be achieved using individual or combinations of the described control means, e.g., the thermoconductive layer 134, the inserts 166, 168, channels 108, conduits 160, the pressure of cooling gas in the channels 108, and the flow of the cooling liquid in the conduits 160. Furthermore, in the discussed above embodiments, pre-determined patterns of the temperature distribution on the substrate supporting surface 176 and in the substrate 150 may additionally be selectively controlled to compensate for non-uniformity of the heat fluxes originated, during processing the substrate 150, by a plasma of the process gas and/or substrate bias.

Figure 6:
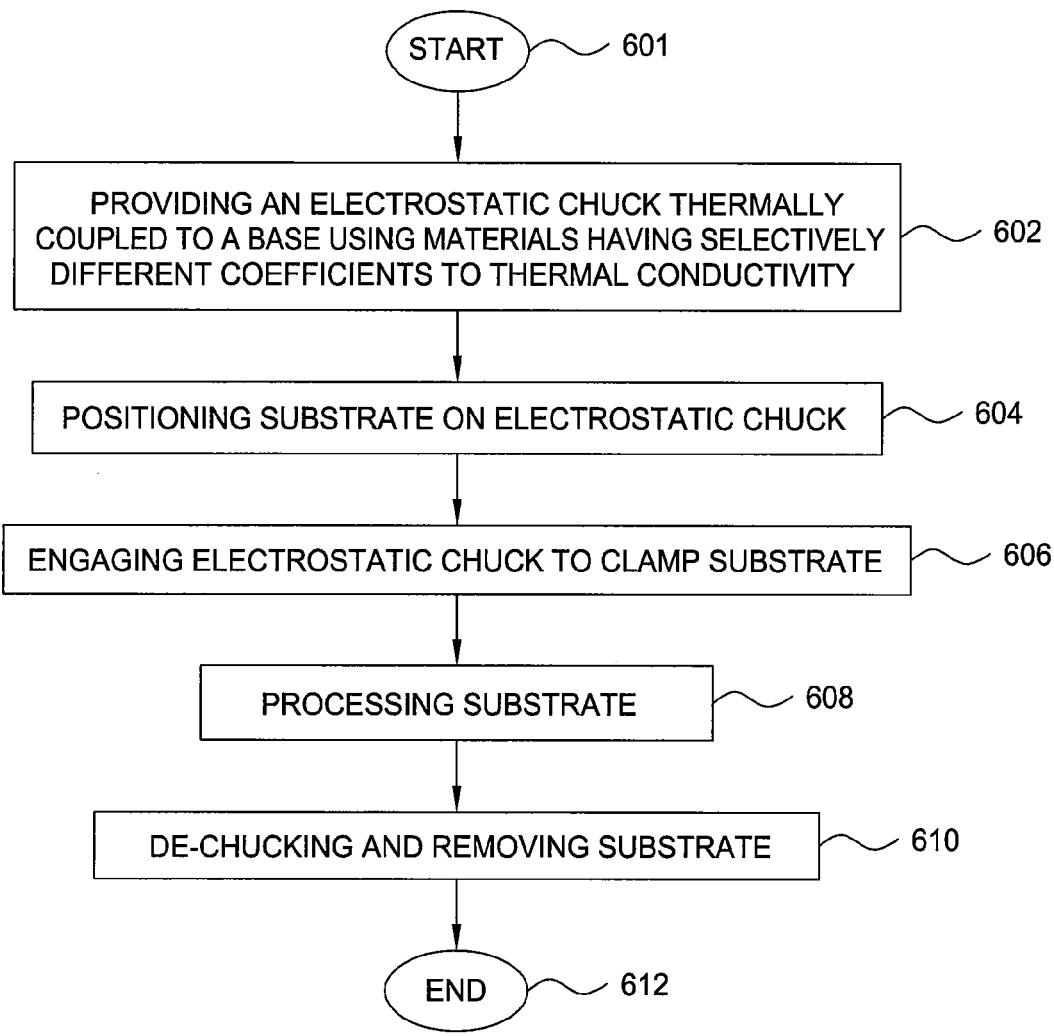
FIG. 6 is a flow diagram of one embodiment of a method for controlling temperature of a substrate disposed on a substrate pedestal.

FIG. 6 depicts a flow diagram of one embodiment of an inventive method for controlling temperature of a substrate processed in a semiconductor substrate processing apparatus as a process 600. The process 600 illustratively includes the processing steps performed upon the substrate 150 during processing in the reactor 100 described in the embodiments above. It is contemplated that the process 600 may be performed in other processing systems.

The process 600 starts at step 601 and proceeds to step 602. At step 602, the substrate 150 is transferred to the pedestal assembly 116 disposed in the process chamber 110. At step 604, the substrate 150 is positioned (e.g., using a substrate robot, not shown) on the substrate supporting surface 176 of the electrostatic chuck 188. At step 606, the power supply 132 engages the electrostatic chuck 188 to clamp the substrate 150 to the supporting surface 176 of the chuck 188. At step 608, the substrate 150 is processed (e.g., etched) in the process chamber 110 in accordance with a process recipe executed as directed by the controller 140. During step 608, the substrate pedestal assembly 116 facilitates a pre-determined pattern of temperature distribution in the substrate 150, utilizing one or more of the temperature control attributes of the pedestal assembly 116 discussed in reference to FIGS. 1-5 above. Optionally, the rate and/or profile of heat transferred through the chuck 114 during step 608 may be adjusted in-situ by changing one or more of the characteristics of the gas present in one or more of the channels 108. Upon completion of processing, at step 610, the power supply 132 disengages the electrostatic chuck 188 and, as such, du-chucks the substrate 150 that is further removed from the process chamber 110. At step 612, the process 600 ends.

FIGS. 7-9 are a vertical sectional view, bottom view and a partial sectional view of one embodiment of a base 700. It is contemplated that the base 700 may be used to advantage with any of the substrate pedestal assemblies described herein. In the embodiment depicted in FIGS. 7-9, the base 700 includes a top surface 702 and a bottom surface 704. A channel 706 is formed in the bottom surface 704 of the base 700. The channel 706 is covered by a cap 708 to form a fluid conduit 710. The conduit 710 includes an inlet 714 and outlet 716 configured to accept a fitting, facilitating attachment to a heat transfer fluid control source 182, as shown in FIG. 1.

In the embodiment depicted in FIGS. 7-9, the channel 706 is machined into the bottom surface 704 of the base 700. The machining operation is performed in a manner that leaves one or more fins 712 extending into the area defined by channel 706. The fin 712 increases the surface area of the conduit 710 available for heat transfer, thereby enhancing the heat transfer between the fluid flowing in the conduit 710 and the base 700.

A cap 708 is disposed in the channel 706 and coupled to the base 700 to define the conduit 710. In the embodiment depicted in FIGS. 7-9, the cap 708 is continuously welded to the base 700 to prevent leakage of the fluid flowing in the conduit 710 under vacuum conditions. It is contemplated that the cap 708 may be sealingly coupled to the base 700 utilizing other leak-tight methods.

FIGS. 10A-H depict bottom views of the base 700 having different configurations for routing the conduit 710. As shown, the conduit 710 may be routed to provide a predetermine temperature profile of the support assembly, thereby controlling the temperature profile of the substrate supported thereon.

Figure 10A:
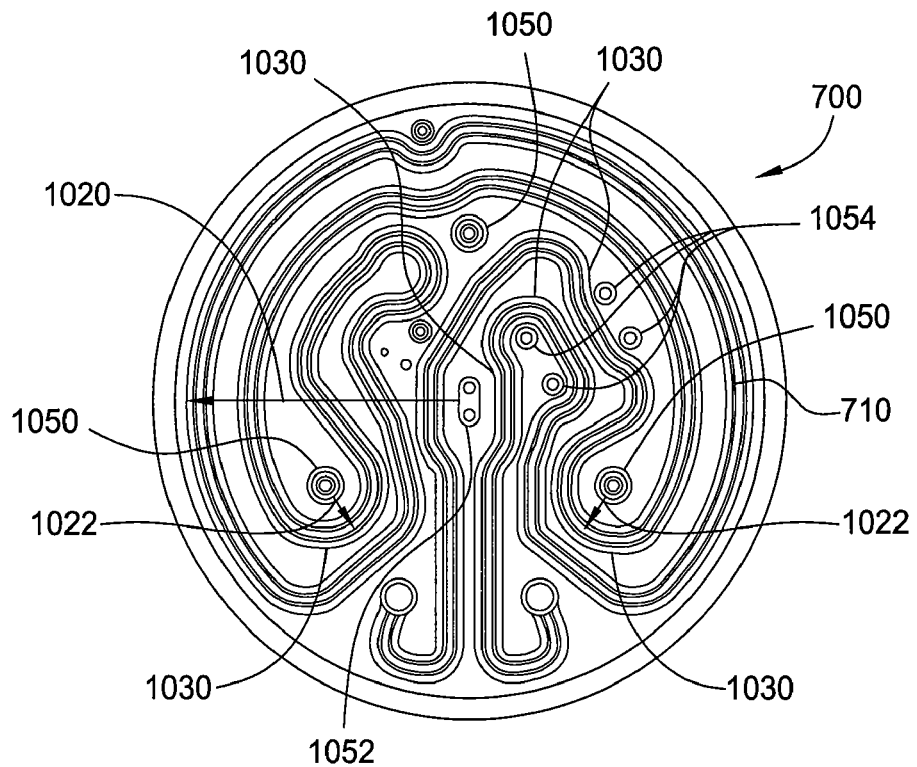
FIGS. 10A-H are bottom views of a base illustrating different configurations for routing a conduit formed therein.

In the embodiment depicted in FIG. 10A, a base 700 includes a conduit 710 that has a major radial orientation (or major radius of curvature) 1020 oriented about a centerline of the base 700. The major radial orientation 1020 may be a spiral pattern and/or have portions configured with a constant radius relative to the centerline of the base 700. The conduit 710 additionally includes one or more wrapping segments 1030. The wrapping segments 1030 generally are have a minor radial orientation (or minor radius of curvature) 1022 which is centered around a void or other passage formed in the base 700. The minor radial orientation generally has a radius of curvature much less than the major radial orientation. Such passages include those utilized for providing electrical and gas utilities to the electrostatic chuck disposed on the base 700. In the embodiment depicted in FIG. 10A, the each wrapping segment 1030 has a minor radial orientation 1022 that is centered around lift pin holes 1050 that extend through the base 700. The lift pin holes 1050 are generally arranged in a polar array. The minor radial orientation 1022 may be defined by a constant radius of the segment 1030 relative to the passage, and/or a discontinuity in the major radial orientation 1020 such as a change between a concave and a convex orientation relative to the centerline of the base 700 as the wrapping segment 1030 passes adjacent to a passage.

Figure 10B:
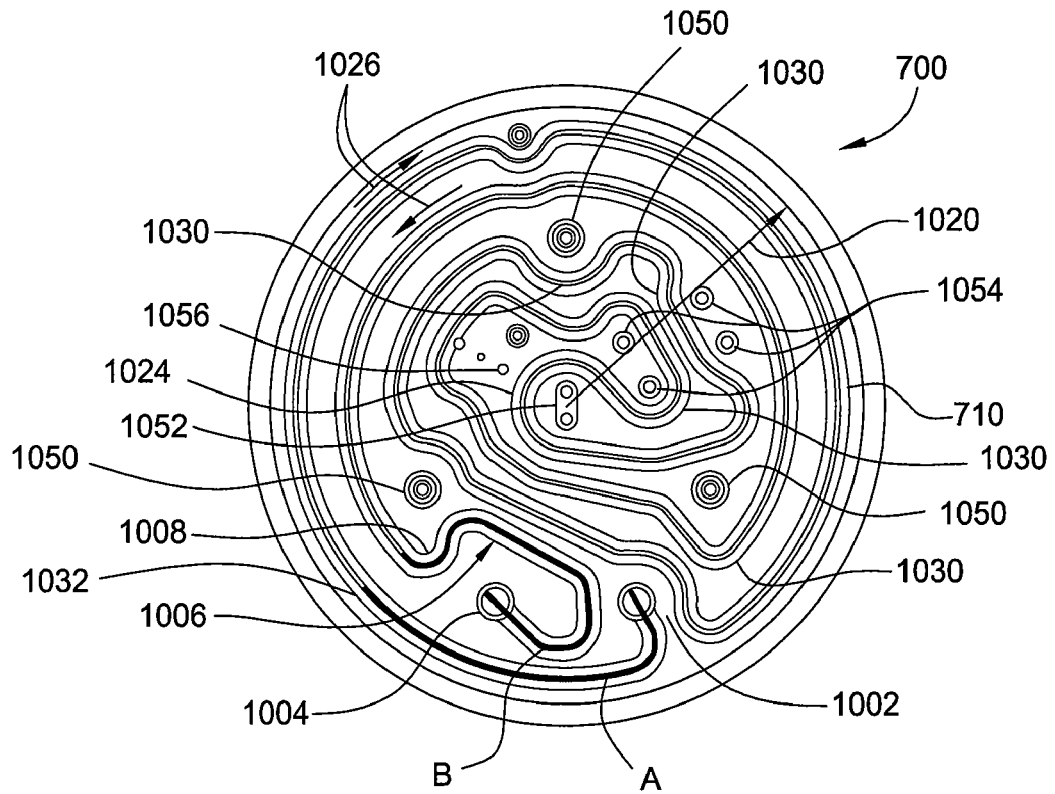
Figure 10C:
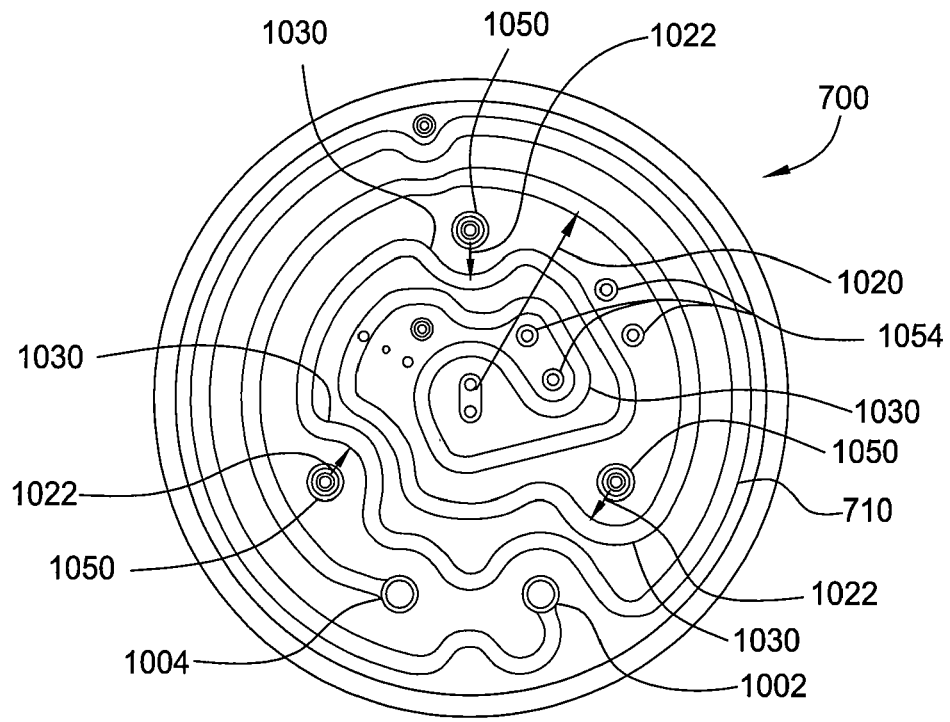
Figure 10D:
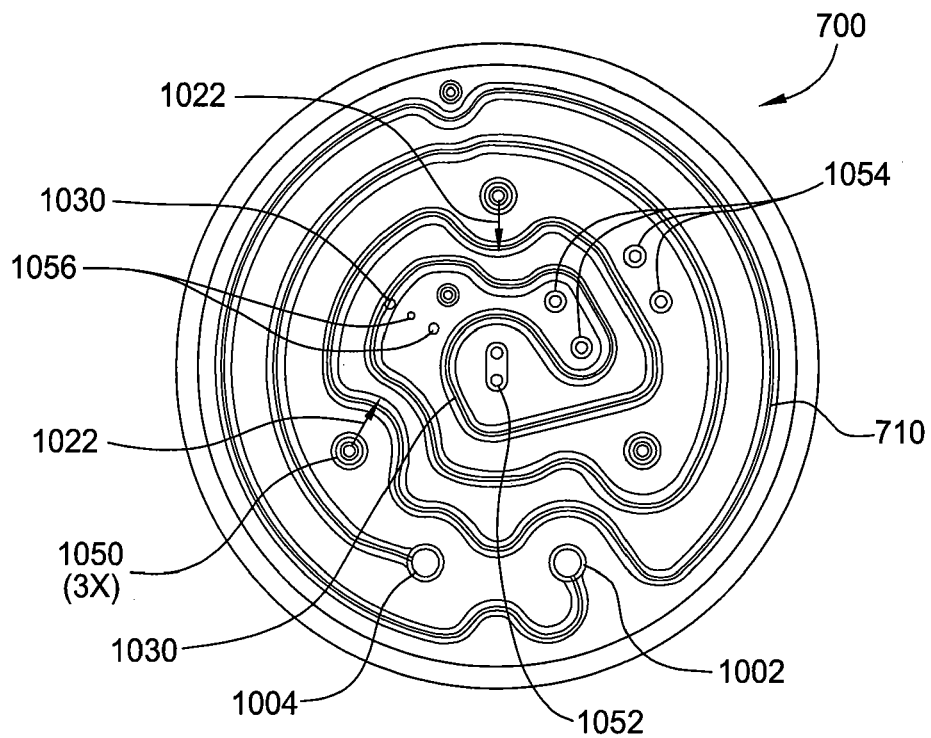
Figure 10E:
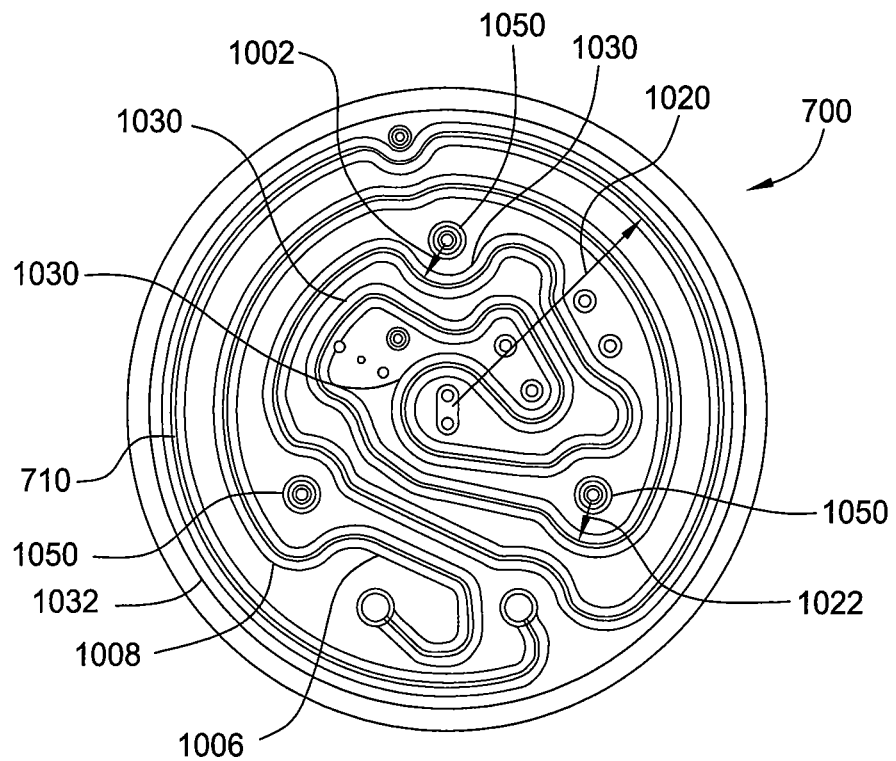
Figure 10F:
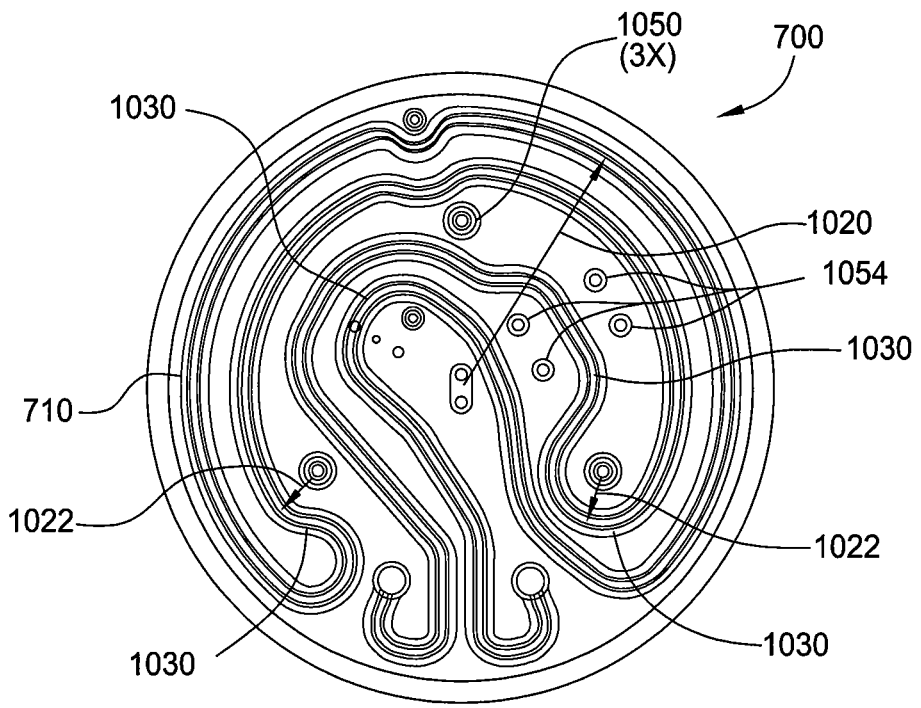
Figure 10G:
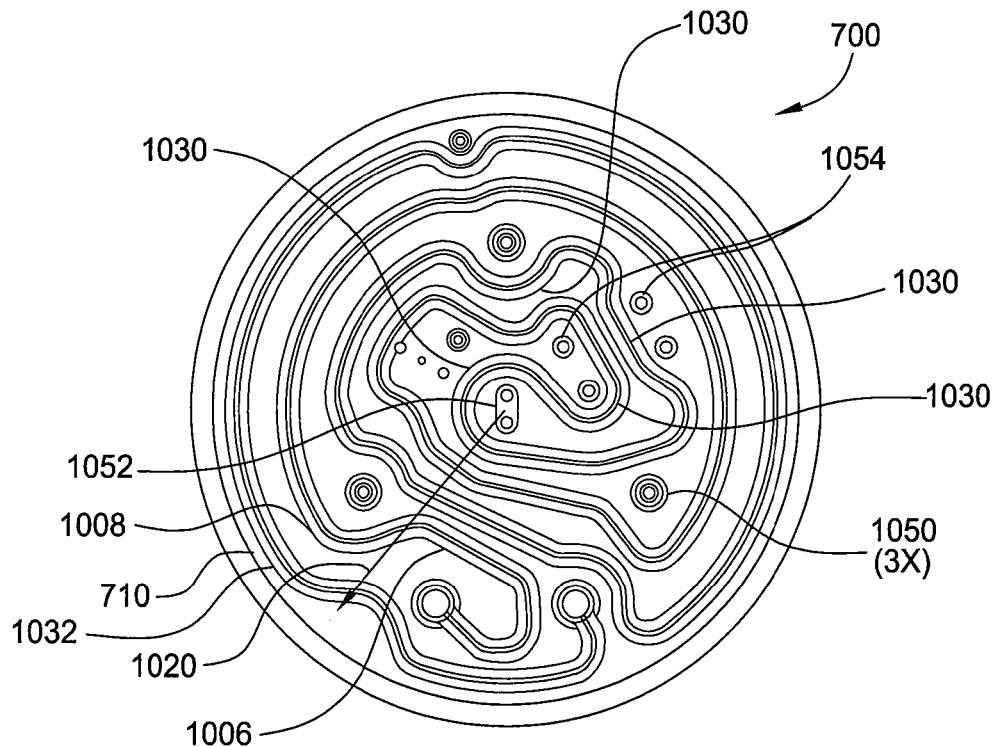
Figure 10H:
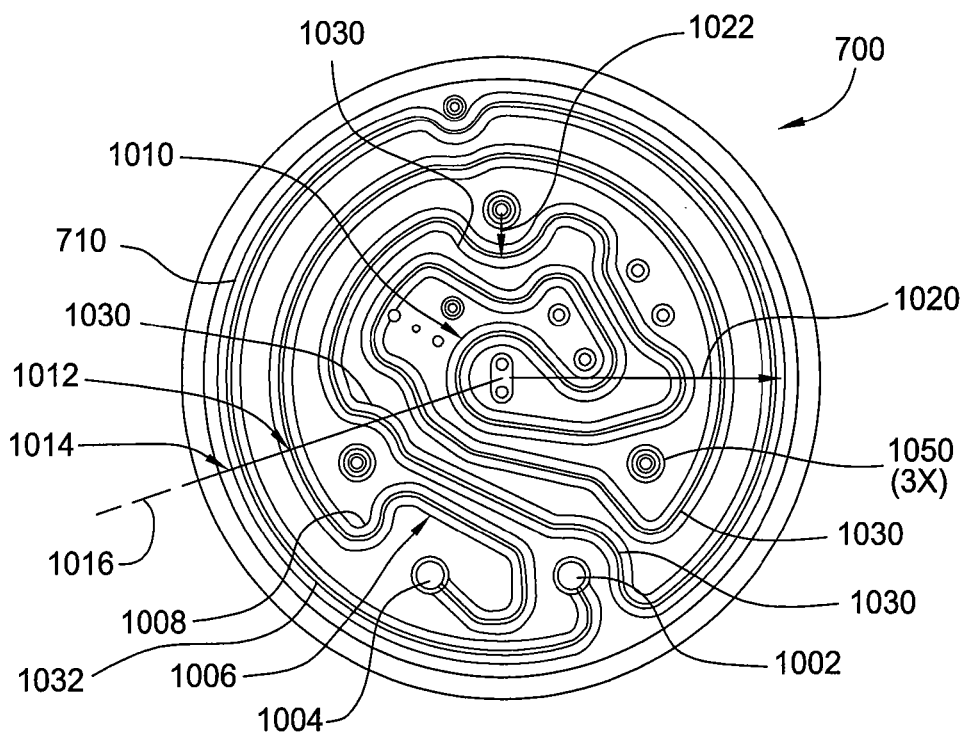

In the embodiment depicted in FIG. 10B, a base 700 includes a conduit 710 that has a major radial orientation 1020 oriented about a centerline of the base 700. A plurality of wrapping segments 1030 are provided at wrap around various apertures (e.g., passages) disposed through the base 700. For example, the wrapping segments 1030 have a minor radial orientation 1022 centered around lift pin holes 1050, electrical conduit holes 1054, DC power feed throughs 1052, and gas passages with 1056 that extend through the base 700. Thus, the wrapping segments 1030 enhances temperature uniformity across the base 700 by providing more heat transport area around the discontinuities formed through the base 700. A discontinuity may also be defined as void or object disposed in, or displacing the material of the base.

Also shown in the embodiment depicted in FIG. 10B, a portion of the conduit 710 formed in the base 700 includes a loop 1006. The loop 1006 is generally defined in a portion of the conduit 710 terminating at the outlet 1004 of the conduit 710. The loop 1006 is configured such that that the end of the loop 1008 is substantially equidistant from a midpoint 1024 (by length of conduit) as a adjacent portion 1032 of the conduit 710 terminating at an inlet of the conduit 710. The loop 1006 may also be configured such that a conduit length B defined from the end 1008 of the loop 1006 to the outlet 1004 is essentially equal to a conduit length A define from the inlet 1002 to a position 1024 radially adjacent to the end 1008 of the loop 1006. In one embodiment, the length A is within 10 percent of the length B. In this manner, the adjacent portions of the conduit 710 located at just about all angular positions of the conduit have fluid flowing toward and away from the mid point 1024 of the conduit 710 (as shown by arrows 1026) that are maintained at a substantially constant average temperature. Thus, the loop 1006 enhances temperature uniformity across the base 700. FIGS. 10C-H depict other layouts for the conduit 710 having various configurations for the wrapping segments 1030 and/or the loop 1006.

Figure 12:
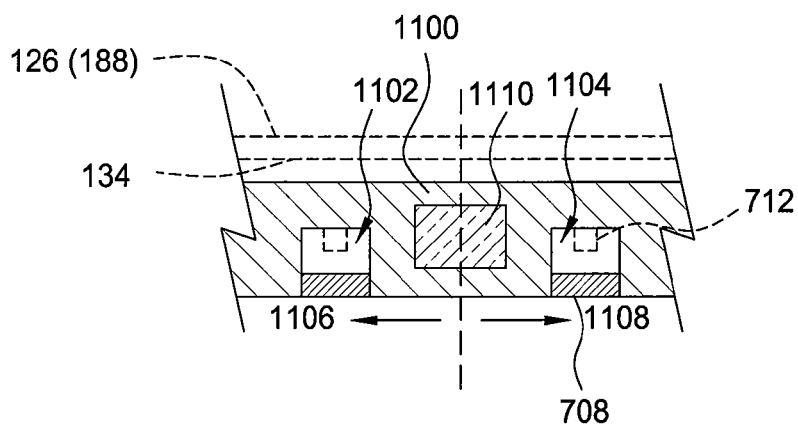
FIG. 12 is a partial sectional views of the base of FIG. 11.
Figure 11:
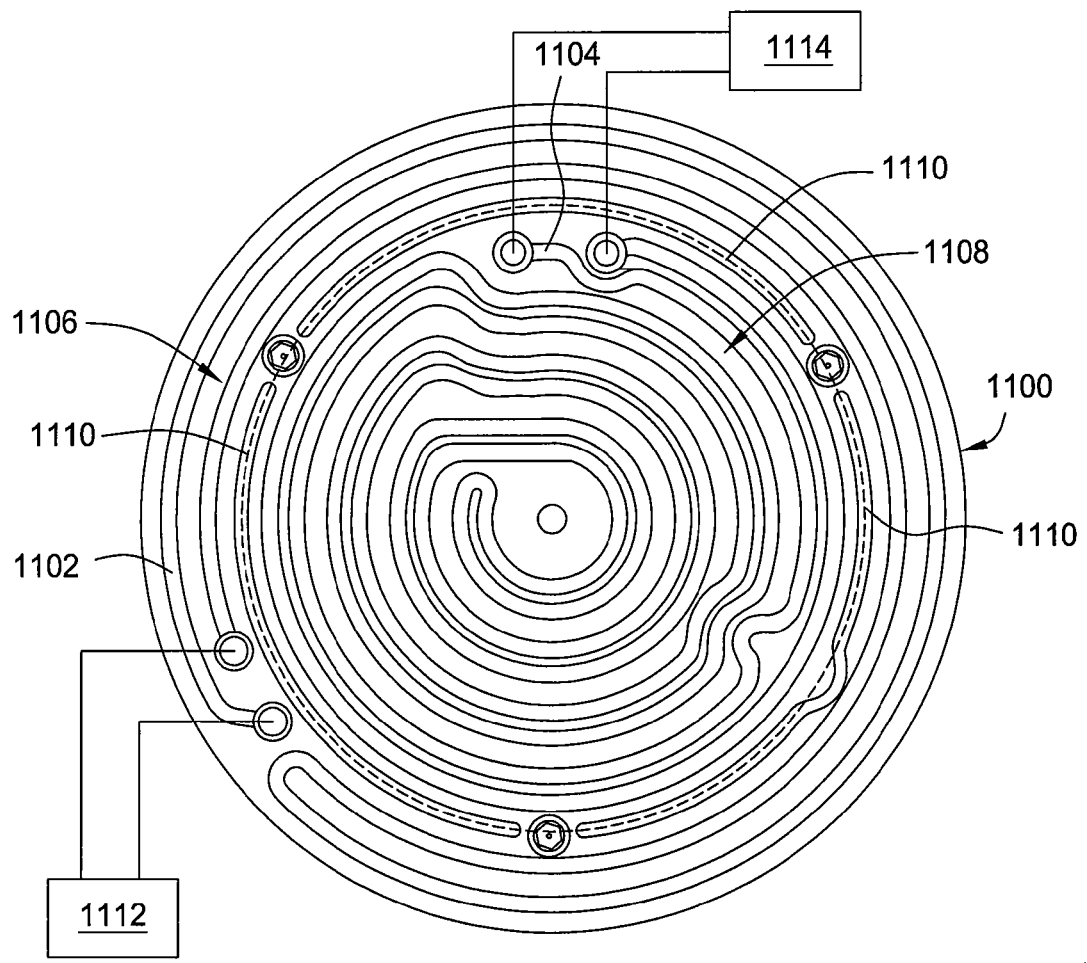
FIG. 11 is a bottom view of another embodiment of a base of a pedestal assembly.

FIGS. 11-12 depict bottom and partial sectional views of another embodiment of a base 1100 which may be utilized in the substrate pedestal assemblies described herein. The base 1100 depicted in FIGS. 11-12 generally include at least two separate cooling loops 1102, 1104 formed in the base 1100 to define at least two independently controllable temperature zones 1106, 1108. The cooling loops 1102, 1104 are generally conduits formed as described above, or by other suitable method. In one embodiment, the first cooling loop 1102 is arranged radially outward of the second cooling loop 1104 such that the temperature control zones 1106, 1108 are concentric. It is contemplated that the loops 1102, 1104 may radially orientated, or have other geometric configurations. The cooling loops 1102, 1104 may be coupled to a single source of a temperature controlled heat transfer fluid, or as in the embodiment depicted in FIG. 11, each loop 1102, 1104 may be respectively coupled to a separate heat transfer fluid source 1112, 1114 so that the temperature in the zones 1106, 1108 may be independently controlled. Optionally, an insert 1110, similar to the insert 168 described above, is laterally disposed between the first and second cooling loops insert 168 to provide enhanced thermal isolation between the zones 1106, 1108. The insert 1110 may extend to the lower surface of the base 1100, as shown in FIG. 11, or be embedded in the base 1100, as shown in FIG. 12.

Thus, a substrate support pedestal assembly has been provided that enables flexible temperature control of a substrate support thereon. The different features to the substrate support pedestal assembly may be selected to provide multiple zones of temperature control, thereby enabling the temperature profile of the substrate to be controlled.

While the foregoing is directed to embodiments of the present invention, other and further embodiments of the invention may be devised without departing from the basic scope thereof, and the scope thereof is determined by the claims that follow.

What is claimed is:

1. A substrate pedestal assembly comprising:
an electrostatic chuck having at least one chucking electrode disposed therein;
a metallic base coupled to a bottom surface of the electrostatic chuck;
a first aperture extending through the base; and
a fluid conduit disposed in at least one of the electrostatic chuck and the base, wherein the fluid conduit includes a segment wrapping around the first aperture, wherein the fluid conduit further comprises an inlet and an outlet, and wherein a portion of the fluid conduit extending from the inlet further comprise a loop portion having an end, such that a conduit length A defined from the end of the loop portion to the inlet is substantially equal to a conduit length B defined from the outlet to a position radially adjacent the end of the loop.

2. The substrate pedestal assembly of claim 1 further comprising:
electrical conductors coupled to the electrostatic chuck and extending through the first aperture.

3. The substrate pedestal assembly of claim 1 further comprising:
at least one backside gas channel formed in a substrate supporting surface of the electrostatic chuck and coupled to the first aperture.

4. The substrate pedestal assembly of claim 1, wherein the first aperture further comprises:
one of a plurality of lift pin holes formed through the base and electrostatic chuck, the lift pin holes arranged in a polar array.

5. The substrate pedestal assembly of claim 1, wherein the length of conduit length A is within 10 percent of the length of conduit length B.

6. The substrate pedestal assembly of claim 1 further comprising:
a second aperture formed through the base, wherein the fluid conduit includes a second segment wrapping around the second aperture.

7. The substrate pedestal assembly of claim 6, wherein the second aperture further comprises:
one of a plurality of lift pin holes formed through the base and electrostatic chuck, the lift pin holes arranged in a polar array, and wherein the second aperture further comprises:
a backside gas delivery hole or an electrical conduit for lead coupled to the electrostatic chuck.

8. The substrate pedestal assembly of claim 1, wherein the fluid conduit further comprises:
a major radius of curvature substantially defining a path of the fluid conduit through the base; and
a minor radius of curvature defining a path of the segment, wherein the major radius is substantially greater than the minor radius.

9. The substrate pedestal assembly of claim 1 further comprising:
a second fluid conduit formed in the base radially inward of the fluid conduit.

10. A substrate pedestal assembly comprising:
an electrostatic chuck having at least one chucking electrode disposed therein;
a metallic base coupled to a bottom surface of the electrostatic chuck;
an aperture extending through the base; and
a fluid conduit disposed in at least one of the electrostatic chuck and the base, wherein the fluid conduit includes a segment wrapping around the aperture: wherein the fluid conduit further comprises a midpoint defined between an inlet and an outlet of the fluid conduit, wherein a first portion of the fluid conduit is defined between the midpoint and the outlet, and a second portion of the fluid conduit is defined between the midpoint and the outlet, the first portion tracking the second portion of the fluid conduit in a spaced-apart relation, and wherein a first length A defined from the midpoint of the conduit to a first position is substantially equal to a second length B defined from the midpoint of the conduit to a second position radially outward of the first position.

11. The substrate pedestal assembly of claim 10, wherein the length of first length A is within 10 percent of the length of second length B.

12. A substrate pedestal assembly comprising:

an electrostatic chuck having at least one chucking electrode disposed therein;

a metallic base coupled to a bottom surface of the electrostatic chuck;

a first aperture extending through the base;

a fluid conduit disposed in at least one of the electrostatic chuck and the base, wherein the fluid conduit includes a segment wrapping around the first aperture; and an insert disposed between adjacent portions of the fluid conduit and having a coefficient of thermal conductivity less than a coefficient of thermal conductivity of the base.

13. A substrate pedestal assembly comprising:

a ceramic electrostatic chuck having at least one chucking electrode disposed between a substrate supporting surface and a bottom surface;

a metallic base coupled to the bottom surface of the electrostatic chuck;

a plurality of lift pin holes extending through the electrostatic chuck and base;

a fluid conduit loop disposed in the base in a generally spiral orientation, wherein the fluid conduit includes a segment defined adjacent at least one of the lift pin holes that has an orientation centered around the lift pin hole;

a first void having AC lead coupled to the electrostatic chuck, the first void positioned outside the loop and having a segment of the fluid conduit wrapping thereround;

a second void having DC lead coupled to the electrostatic chuck, the second void positioned inside the loop and having a segment of the fluid conduit wrapping thereround; and a third void providing a backside gas channel to the substrate supporting surface of the electrostatic chuck, the third void positioned outside the loop and having a segment of the fluid conduit wrapping thereround.

14. The substrate pedestal assembly of claim 13, wherein the segment has a constant radius.

* * * * *

UNITED STATES PATENT AND TRADEMARK OFFICE
CERTIFICATE OF CORRECTION

PATENT NO. : 7,436,645 B2 Page 1 of 1
APPLICATION NO. : 11/531474
DATED : September 13, 2006
INVENTOR(S) : Holland et al.

It is certified that error appears in the above-identified patent and that said Letters Patent is hereby corrected as shown below:

On the Title page, item [75]: Column 1 (Inventors), Line 7, delete "Milpitas" and insert -- San Jose, --, therefor.

Column 9: In Claim 1, line 8 delete "adiacent" and insert -- adjacent --, therefor.

Column 10: In Claim 10, line 59 delete "aperture:" and insert -- aperture; --, therefor.

Signed and Sealed this

Twentieth Day of January, 2009

JON W. DUDAS
*Director of the United States Patent and Trademark Office*

UNITED STATES PATENT AND TRADEMARK OFFICE
CERTIFICATE OF CORRECTION

PATENT NO. : 7,436,645 B2  Page 1 of 1
APPLICATION NO. : 11/531474
DATED : October 14, 2008
INVENTOR(S) : Holland et al.

It is certified that error appears in the above-identified patent and that said Letters Patent is hereby corrected as shown below:

On the Title page, item [75]: Column 1 (Inventors), Line 7, delete "Milpitas" and insert -- San Jose, --, therefor.

Column 9: In Claim 1, line 8 delete "adiacent" and insert -- adjacent --, therefor.

Column 10: In Claim 10, line 59 delete "aperture:" and insert -- aperture; --, therefor.

This certificate supersedes the Certificate of Correction issued January 20, 2009.

Signed and Sealed this

Seventeenth Day of February, 2009

JOHN DOLL
*Acting Director of the United States Patent and Trademark Office*